United States Patent [19]

Ihochi et al.

[11] 3,729,820

[45] May 1, 1973

[54] METHOD FOR MANUFACTURING A PACKAGE OF A SEMICONDUCTOR ELEMENT

[75] Inventors: Takahiko Ihochi; Tomio Yamada, both of Kodaira, Japan

[73] Assignee: Hitachi, Ltd., Tokyo, Japan

[22] Filed: Mar. 6, 1970

[21] Appl. No.: 17,207

[30] Foreign Application Priority Data

Mar. 12, 1969 Japan ................................44/18330

[52] U.S. Cl. ........................29/627, 29/589, 29/590, 29/626, 174/52 S, 174/DIG. 3, 317/234

[51] Int. Cl. ..............................................H05k 3/28

[58] Field of Search .........................174/52 S, 52 PE, 174/52 FP, 68.5; 29/588–590; 204/15; 317/234 M

[56] References Cited

UNITED STATES PATENTS

| | | | |
|---|---|---|---|
| 3,517,279 | 6/1970 | Ikeda et al. | 317/234 M UX |
| 3,404,214 | 10/1968 | Elliott | 174/DIG. 3 |
| 3,404,215 | 10/1968 | Burks et al. | 174/DIG. 3 |
| 3,495,023 | 2/1970 | Hessinger et al. | 174/DIG. 3 |

*Primary Examiner*—Bernard A. Gilheany
*Attorney*—Craig and Antonelli

[57] ABSTRACT

A method of manufacturing a flat package having a casing for accommodating semiconductor elements, in which a conducting lead is adherent to a portion of a metallized layer leading out from the casing to the surface of the package, and the exposed surface of the metallized layer outside the casing is coated with an alloy layer of lead-tin, thereby preventing the corrosion of the metallized layer.

1 Claim, 5 Drawing Figures

INVENTOR

TAKAHIKO IHOCHI and TOMIO YAMADA

BY Craig, Antonelli, Stewart & Hill

ATTORNEYS

METHOD FOR MANUFACTURING A PACKAGE OF A SEMICONDUCTOR ELEMENT

BACKGROUND OF THE INVENTION

1. Field of the Invention

This invention relates to a method of manufacturing a casing of a semiconductor device, and more particularly a method of manufacturing a flat package suitable for accommodating a semiconductor integrated circuit.

2. Description of the Prior Art

In a known casing for a semiconductor device called a flat package or a dual in line package, a metallized layer of molybdenum-manganese is formed on a ceramic plate, and a gold plating is applied to this metallized layer to form fitting portions for a semiconductor substrate, wirings and external lead-out electrodes. This package, however, has the following disadvantages shown in an environmental test. Due to pinholes, imperfectly plated portions, and scars in the gold plating layer, the metallized layer of molybdenum-manganese having a large ionization tendency is corroded by a localized galvanic action. As a result, the metallized layer suffers from the breakage of wires or a degradation of its mechanical strength, or precipitations (hydroxides of molybdenum and manganese) extending over the surface of the ceramic plate cause deterioration of the insulation resistance between the metallized wirings. For example, the insulation resistance of metallized layers with 1 mm gap therebetween drops from $10^{14}$ Ωprior to a high temperature and moisture test at 80°C with 90 percent moisture for 168 hours to about $10^{-8}$ Ω after the test.

The above defects may be some degree reduced by thickening the gold plated layer in order not to expose the underlying metal. For this purpose, however, a large amount of very precious gold would have to be used, whence the method becomes economically undesirable. Furthermore, even by this method the external portions of a metallized layer near the wall of a casing leading out therefrom may not be satisfactorily gold plated, and a problem of not being able to attain enough anti-corrosiveness in this portion arises.

SUMMARY OF THE INVENTION

An object of this invention is to provide a method of manufacturing a highly reliable package for semiconductor elements at a low price.

Another object of this invention is to provide a method of preventing the corrosion of a metallized layer extending over the surface of a flat package which accommodates an integrated circuit.

According to one embodiment of this invention, a method of manufacturing a package having a casing of a semiconductor element is provided, wherein a conducting lead is attached to one end of a metallized layer leading out from the casing to the surface of the package; the metallized layer and conducting lead are both plated with gold; and finally the gold plated layers are dipped into a lead-tin solder bath to replace the gold plated layers on the surfaces of the metallized layer and conducting lead by lead-tin soldered layers, thereby preventing the corrosion of the metallized layer.

The above and other objects and advantages of the present invention will be made more apparent from the preferred embodiments with reference to the accompanying drawings.

DESCRIPTION OF THE PREFERRED EMBODIMENT

An embodiment of this invention will be explained in particular with reference to a method of manufacturing a flat package suitable for accommodating a semiconductor integrated circuit.

Figure 1:
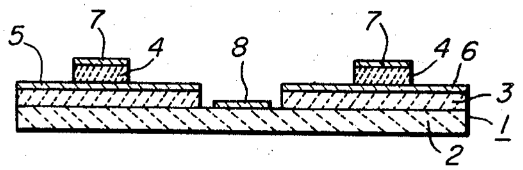
FIGS. 1 to 5 show the cross sections of the manufacturing steps of a flat package according to one embodiment of this invention.

First, a body of package 1 as shown in FIG. 1 is prepared. This body 1 is formed by stacked ceramic sheets 2, 3 and 4 whose major ingredient is alumina or beryllium oxide and whose thickness is 0.05 to 1 mm, then by hot-pressing and sintering these sheets at 1,500 to 1,600°C. A metallized layer 8 is preliminarily formed on a portion of the sheet 2 where a semiconductor substrate is to be disposed. The metallized layers 5 and 6 extend over the surface of the sheet 3. The center portion of the sheet 3 corresponding to the metallized layer 8 is perforated to expose the same. Similarly, the sheet 4 is annularly formed to surround the prescribed surface area of the sheet 3. A metallized layer 7 is formed on the major surface of the sheet 4. The metallized layers 5, 6, 7 and 8 are formed by the use of the well-known screen printing method, i.e., coating a metal ink mainly consisting of molybdenum-manganese on the prescribed surfaces of the sheets.

Figure 2:
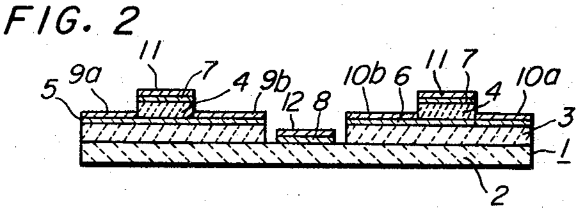

Next, in order to simplify the lead attaching process in the later steps, nickel plating layers 9*a*, 9*b*, 10*a*, 10*b*, 11 and 12 having a thickness of 2 to 7 μ are formed on the surfaces of the metallized layers 5, 6, 7 and 8 respectively, as shown in FIG. 2.

Figure 3:
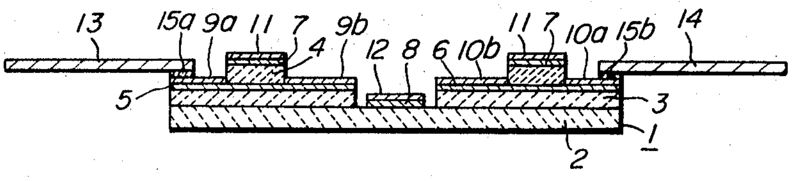

As shown in FIG. 3, using an alloy of silver and copper for the soldering layers 15*a* and 15*b*, leads 13 and 14 are connected to the ends of the nickel-plated metallized layers 5 and 6 respectively.

Figure 4:
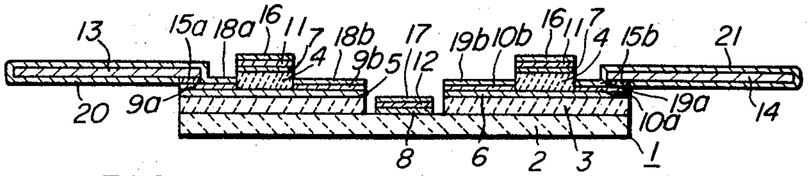

As shown in FIG. 4, gold plated layers 20, 21, 18*a*, 18*b*, 19*a*, 19*b*, 16 and 17 with thickness of about 1 to 4 μ are formed on the surfaces of leads 13 and 14 and of nickel layers 9*a*, 9*b*, 10*a*, 10*b*, 11 and 12 respectively. These gold plated layers are formed by the electroplating method in the same way as the above nickel-plated layers.

Figure 5:
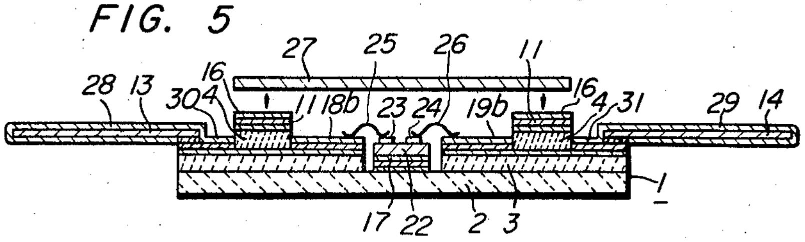

Further, as shown in FIG. 5, the gold layers 18*a*, 20, 19*a* and 21 positioned outside the ceramic plate 4 are dipped in a bath of solder which consists of lead 40 percent and tin 60 percent fused at 250°C. Dipping is performed for 5 to 10 seconds. Next, the body of the package is taken out of the bath and is cooled.

By the above treatment in this embodiment, according to which the gold layers on the surfaces of the conductors 13 and 14 fuse into the fused solder in the bath in the form of a gold-tin eutectic alloy, the surfaces of the metallized layers and leads of molybdenum, manganese and nickel outside the casing are wetted with solder. Thus, on the surfaces of the metallized layers and leads taken out of the solder bath, solder layers 30, 31, 28 and 29 of 3 to 10μ thickness, preferably 3 to 5 μ, containing a small amount of gold are formed instead of the gold layers 18*a*, 19*a*, 20 and 21 respectively.

On the gold layer 17 a substrate of semiconductor integrated circuit of silicon 22 is bonded. The electrodes 23 and 24 formed on the major surface of the substrate of the semiconductor integrated circuit are firmly connected to the gold layers 18*b* and 19*b* with the connecting wires 25 and 26 of, e.g., gold respectively. The connection is performed either by the ultrasonic bonding method or by the thermocompression bonding method. After the connection of the substrate and connecting wires, a metal cover 27 is fused onto the gold layers 16 over the ceramic frame 4, whereby the silicon integrated circuit substrate 22 is sealed in airtight.

Since solder layers whose ionization tendency is larger than that of gold are formed on the surface of the metallized layers and leads, the corrosion thereof can be prevented. The shortcomings of the prior art, such as breaking of wires, weak mechanical strength, and low insulation resistance are eliminated. Since the surfaces of the leads are coated with the solder plated layer, the solderability of the leads is extremely good. Further, by the formation of the gold layers 18*b*, 19*b* and 17 on the necessary portions in the casing, a firm inner connection is attained. Thus, a highly reliable package with perfect connections and a strong anticorrosive property is obtained.

The above solder is not always limited to the lead-tin solder, but may be a metal eutectic with gold at a relatively low temperature without damaging the semiconductor device by heat, e.g., cadmium, zinc, lead, tin and alloys thereof, e.g., lead-tin solder and cadimium-tin solder.

Although this invention has been explained with reference only to one embodiment, it is not limited thereto but may be altered without departing from the spirit of the invention. For example, it is possible to use the electro-plating or the chemical plating method for plating the above solder onto the surface of the gold plated layers, and thereafter by heating the gold layers are fused into solder plating layers in order to decrease their ionization tendency, whereby corrosion of the underlying metals is prevented. The step of depositing soldered layers on the external metallized layers and leads may be performed after fitting the semiconductor substrate to the ceramic plate 2 and making the necessary wirings.

What is claimed is:

1. A method of manufacturing a package for a semiconductor device comprising the steps of:

a. preparing a combination of an insulating substrate having a major surface, an insulating frame disposed on said major surface so as to surround a prescribed region of said major surface, a first metal layer of a first metal having a larger ionization tendency than that of gold and formed on said major surface so as to extend from said prescribed region toward the outside of said frame through a gap between said insulating frame and said substrate; a first gold layer covering a first portion of said first metal layer on said prescribed region, and a second gold layer covering a second portion of said first metal layer extending toward the outside of said frame;

b. disposing a semiconductor element on said prescribed region and electrically connecting said semiconductor element to said first portion of said first metal layer through said first gold layer;

c. covering said frame with a sealing means and forming an air-tight space surrounding said semiconductor element; and d. bringing said second gold layer into contact with a fused solution of a second metal comprising a solder selected from the group consisting of lead, tin, zinc, cadmium and an alloy of an arbitrary combination thereof, so as to dissolve only the gold of said second gold layer into said fused solution of said second metal.

* * * * *